(12) United States Patent
Kojima et al.

(10) Patent No.: US 10,309,005 B2
(45) Date of Patent: *Jun. 4, 2019

(54) DEPOSITION DEVICE AND DEPOSITION METHOD

(71) Applicant: TOKYO ELECTRON LIMITED, Tokyo (JP)

(72) Inventors: Yasuhiko Kojima, Nirasaki (JP); Hiroshi Sone, Nirasaki (JP); Atsushi Gomi, Nirasaki (JP); Kanto Nakamura, Nirasaki (JP); Toru Kitada, Nirasaki (JP); Yasunobu Suzuki, Nirasaki (JP); Yusuke Suzuki, Beaverton, OR (US); Koichi Takatsuki, Nirasaki (JP); Tatsuo Hirasawa, Nirasaki (JP); Keisuke Sato, Nirasaki (JP); Chiaki Yasumuro, Nirasaki (JP); Atsushi Shimada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 34 days.

This patent is subject to a terminal disclaimer.

(21) Appl. No.: 15/032,688

(22) PCT Filed: Aug. 28, 2014

(86) PCT No.: PCT/JP2014/072636
§ 371 (c)(1),
(2) Date: Apr. 28, 2016

(87) PCT Pub. No.: WO2015/064194
PCT Pub. Date: May 7, 2015

(65) Prior Publication Data
US 2016/0251746 A1    Sep. 1, 2016

(30) Foreign Application Priority Data

Oct. 30, 2013  (JP) ................. 2013-225766

(51) Int. Cl.
*H01J 37/34*    (2006.01)
*H01J 37/32*    (2006.01)
(Continued)

(52) U.S. Cl.
CPC ...... *C23C 14/0036* (2013.01); *C23C 14/0063* (2013.01); *C23C 14/081* (2013.01);
(Continued)

(58) Field of Classification Search
CPC ................... C23C 14/0036; C23C 14/0063
See application file for complete search history.

(56) References Cited

U.S. PATENT DOCUMENTS 5,382,339 A * 1/1995 Aranovich ............. C23C 14/34
204/192.12
5,827,408 A * 10/1998 Raaijmakers ......... C23C 14/046
204/192.12

(Continued)

FOREIGN PATENT DOCUMENTS

EP    0860513 A2    8/1998
JP    S63-076868 A  4/1988
(Continued)

OTHER PUBLICATIONS

International Search Report dated Dec. 2, 2014 issued in corresponding International Application No. PCT/JP2014/072636.

*Primary Examiner* — John J Brayton
(74) *Attorney, Agent, or Firm* — Nath, Goldberg & Meyer; Jerald L. Meyer

(57) ABSTRACT

A deposition device according to one embodiment includes a processing container. A mounting table is installed inside the processing container, and a metal target is installed above the mounting table. Further, a head is configured to inject an oxidizing gas toward the mounting table. This head is configured to move between a first region that is defined
(Continued)

between the metal target and a mounting region where a target object is mounted on the mounting table and a second region spaced apart from a space defined between the metal target and the mounting region.

19 Claims, 11 Drawing Sheets

(51) Int. Cl.
*C23C 14/35* (2006.01)
*C23C 14/16* (2006.01)
*C23C 14/08* (2006.01)
*C23C 14/00* (2006.01)
*H01L 43/12* (2006.01)
*H01L 43/10* (2006.01)
*H01L 43/08* (2006.01)

(52) U.S. Cl.
CPC .......... *C23C 14/165* (2013.01); *C23C 14/352* (2013.01); *H01J 37/3244* (2013.01); *H01J 37/32449* (2013.01); *H01J 37/3405* (2013.01); *H01J 37/3426* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 6,200,431 B1* | 3/2001 | Sone | C23C 14/0057 |
| | | | 204/192.12 |
| 9,551,060 B2* | 1/2017 | Gomi | H01J 37/3244 |
| 2005/0029091 A1 | 2/2005 | Park et al. | |
| 2007/0227882 A1* | 10/2007 | Trassl | H01J 37/3244 |
| | | | 204/298.02 |
| 2013/0213227 A1* | 8/2013 | Hilbig | B01D 53/22 |
| | | | 95/54 |
| 2013/0288398 A1 | 10/2013 | Yamamoto et al. | |

FOREIGN PATENT DOCUMENTS

| | | |
|---|---|---|
| JP | H5-230640 A | 9/1993 |
| JP | 10-140342 A | 5/1998 |
| JP | 11-152562 A | 6/1999 |
| JP | 2005-42200 A | 2/2005 |
| JP | 2008-172266 A | 7/2008 |
| JP | 2009-65181 A | 3/2009 |
| JP | 2013-249517 A | 12/2013 |
| KR | 1998-071462 A | 10/1998 |
| WO | 2012/086183 A1 | 6/2012 |
| WO | 2013/179575 A1 | 12/2013 |

* cited by examiner

DEPOSITION DEVICE AND DEPOSITION METHOD

This is a National Phase Application filed under 35 U.S.C. 371 as a national stage of PCT/JP2014/072636, filed Aug. 28, 2014, an application claiming the benefit of Japanese Application No. 2013-225766, filed Oct. 30, 2013, the content of each of which is hereby incorporated by reference in its entirety.

TECHNICAL FIELD

Embodiments of the present disclosure relate to a deposition device and a deposition method.

BACKGROUND

In manufacturing an electronic device such as a semiconductor device, various kinds of processes are performed on a target object. Deposition is an example of the processes that are performed on the target object. Further, there is a case where sputtering is used as a kind of deposition.

In addition, a magnetic tunnel junction (MTJ) element has been developed as a kind of electronic device. In the MTJ element, an MgO layer may be used as a tunnel barrier layer. This MgO layer is generally deposited by the following process. That is to say, Mg is deposited on a target object in a sputtering apparatus having an Mg target. Subsequently, the target object is conveyed to an oxidation processing device, which is connected to the sputtering apparatus through a vacuum conveyance device. The target object is exposed to an oxidizing gas inside the oxidation processing device so that Mg is oxidized. The deposition of such an MgO layer is described, for example, in Patent Document 1 below.

PRIOR ART DOCUMENTS

Patent Documents

Patent Document 1: PCT Publication No. WO 2012/086183

However, higher throughput is required for manufacture of an electronic device. Accordingly, when the electronic device includes a metal oxide layer such as an MgO layer, a period of time required for deposition of the metal oxide layer needs to be shortened.

SUMMARY

According to one aspect of the present disclosure, there is provided a deposition device of forming a metal oxide layer. This deposition device includes a processing container, an exhaust device, a mounting table, a metal target, a first gas supply part, a power supply, a second gas supply part, a head, and a head driving mechanism. The exhaust device is configured to depressurize the interior of the processing container. The mounting table is installed inside the processing container and is configured to mount a target object thereon. The metal target is installed above the mounting table. The first gas supply part is configured to supply a gas into the processing container. The power supply generates power for causing positive ions in the gas supplied from the first gas supply part to collide against the metal target. The second gas supply part supplies an oxidizing gas. The head is connected to the second gas supply part and is configured to inject the oxidizing gas toward the mounting table. The head driving mechanism is configured to move the head between a first region that is defined between the metal target and a mounting region where the target object is mounted on the mounting table and a second region spaced apart from a space defined between the metal target and the mounting region. Further, an example of the metal target may include a target formed of Mg.

In the deposition device, the head is placed in the second region so that the metal emitted from the metal target can be deposited on the target object without interference with the head. Further, in the deposition device, the head is placed in the first region and the oxidizing gas is supplied toward the target object, so that the metal deposited on the target object can be oxidized. That is to say, by using the deposition device, the deposition of the metal and the oxidation process of the metal can be performed inside the single processing container. Accordingly, according to the deposition device, it is possible to shorten a period of time required to form the metal oxide layer.

In one embodiment, the deposition device may further include a heater installed in the head. According to this embodiment, it is possible to supply the oxidizing gas heated while passing through the head toward the target object. This further facilitates the oxidation of the metal, which makes it possible to further shorten the period of time required to perform the oxidation process of the metal. Further, in another embodiment, the deposition device may further include a heating mechanism configured to heat the oxidizing gas supplied into the head. The heating mechanism may be installed outside the processing container. According to this embodiment, it is possible to further facilitate the oxidation of the metal, thus further shortening the period of time required to perform the oxidation process of the metal.

In one embodiment, the head may have a planar size larger than that of the mounting region. According to this embodiment, before sputtering of the metal, when performing a process of shaving off a surface of the metal target, i.e., a so-called pre-sputtering process, the target object can be covered by the head. Accordingly, it is possible to reduce or prevent contamination of the target object during the pre-sputtering process.

Further, in the embodiment in which the head has a planar size larger than that of the mounting region, the deposition device may further include a target made of an active metal installed above the mounting table. According to this embodiment, it is possible to coat an inner wall surface of the processing container with an active metal, prior to the deposition of the metal. Further, it is possible to increase a degree of vacuum of the processing container by virtue of a gettering function of the active metal coated on the inner wall surface of the processing container. As a result, it is possible to form a high-quality metal oxide layer. Further, Ti or Ta can be used as the active metal.

Further, in one embodiment, the deposition device may further include a heater installed in the mounting table, and a mounting table driving mechanism configured to rotate the mounting table about a first axis line that vertically extends along a central axis line of the mounting table. Further, the head driving mechanism may pivotably support the head about a second axis line which vertically extends at a lateral side of the mounting table, and a plurality of gas injection ports arranged in a direction perpendicular to the second axis line may be formed in the head.

When the target object is rotated with the rotation of the mounting table, a circumferential velocity at each position of the target object varies depending on a distance from the first axis line. Specifically, the circumferential velocity at each position of the target object is increased as the distance from the center of the target object in a diametrical direction increases. Accordingly, when the head is fixed such that the plurality of gas injection ports extend in the direction perpendicular to the first axis line, an amount to be exposed to oxygen may be decreased as the position becomes closer to an edge of the target object. In order to cope with this phenomenon, in the deposition device of this embodiment, the head driving mechanism moves the head about the second axis line above the mounting table, so that the oxidizing gas can be supplied toward the target object. It is therefore possible to adjust an amount of oxygen to be supplied to each diametrical position of the target object. As a result, it is possible to uniformly adjust an in-plane distribution of the oxidation of the metal.

Further, in another aspect of the present disclosure, a deposition method using the aforementioned deposition device is provided. This deposition method includes the steps of: (a) depositing a metal emitted from the metal target on the target object in a state where the head is placed in the second region, and (b) injecting the oxidizing gas from the head toward the target object to oxidize the metal deposited on the target object, in a state where the head is placed in the first region. In this method, steps (a) and (b) are alternately repeated. According to this deposition method, it is possible to perform the deposition of the metal and the oxidation process of the metal in the single processing container. This shortens a period of time required to form the metal oxide layer. Further, an example of the metal target may include a target made of Mg.

In one embodiment, the deposition device may further include a heater installed in the head. The metal may be oxidized by the oxidizing gas heated in the head in step (b). According to this embodiment, it is possible to further facilitate the oxidation of the metal, thus further shortening the period of time required to perform the oxidation process of the metal. Further, in another embodiment, the deposition device may further include a heating mechanism configured to heat the oxidizing gas supplied into the head. The heating mechanism is installed outside the processing container. The metal may be oxidized by the oxidizing gas heated by the heating mechanism in step (b). According to this embodiment, it is possible to further facilitate the oxidation of the metal, thus further shortening the period of time required to perform the oxidation process of the metal.

Further, in one embodiment, the head may have a planar size larger than that of the mounting region. The deposition method may further include, before step (a), the step of causing the positive ions to collide against the metal target in the state where the head is placed in the first region. According to this embodiment, it is possible to reduce or prevent contamination of the target object during the pre-sputtering process.

Moreover, when the head has the planar size larger than that of the mounting region, the deposition device may further include a target made of an active metal installed above the mounting table. In one embodiment using this deposition device, the deposition method may further include, before step (a), the step of causing the positive ions to collide against the target made of the active metal in the state where the head is placed in the first region. According to this embodiment, it is possible to increase a degree of vacuum of the processing container by virtue of a gettering function of the active metal coated on the inner wall surface of the processing container. As a result, it is possible to form a high-quality metal oxide layer. Further, Ti or Ta may be used as the active metal.

Further, the deposition device may further include a heater installed in the mounting table, and a mounting table driving mechanism configured to rotate the mounting table about a first axis line that vertically extends along a central axis line of the mounting table. The head driving mechanism pivotably supports the head about a second axis line that vertically extends at a lateral side of the mounting table. A plurality of gas injection ports arranged in a direction perpendicular to the second axis line may be formed in the head. In one embodiment using this deposition device, the head may be moved about the second axis line above the mounting table in step (b). According to the deposition method of this embodiment, it is possible to adjust an amount of oxygen to be supplied to each diametrical position of the target object. As a result, it is possible to uniformly adjust an in-plane distribution of the oxidation of the metal.

As described above, it is possible to shorten a period of time required for forming the metal oxide layer, according to various aspects and embodiments of the present disclosure.

DETAILED DESCRIPTION

Figure 1:
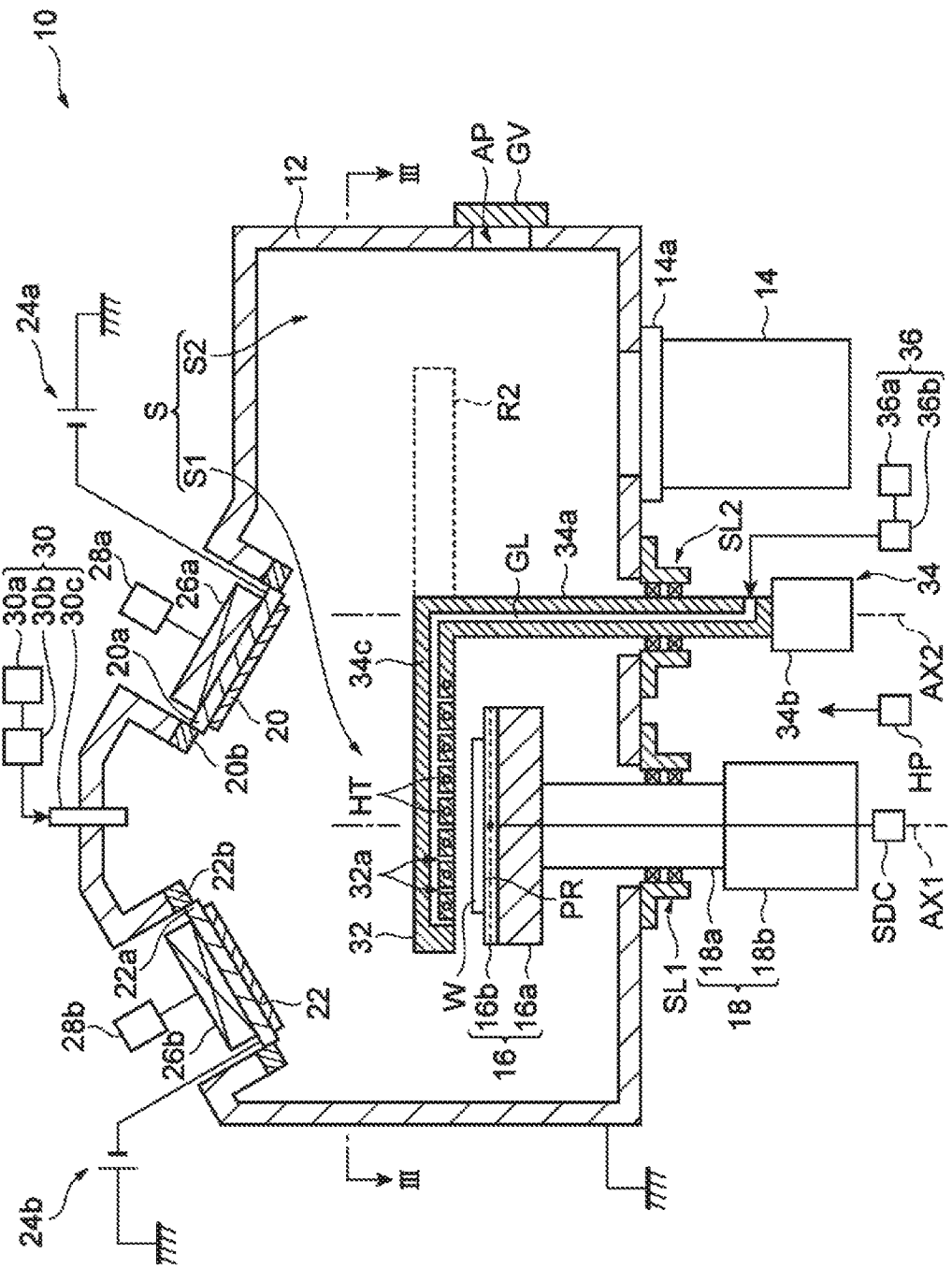
FIG. 1 is a view illustrating a deposition device according to one embodiment of the present disclosure.

Hereinafter, various embodiments of the present disclosure will be described in detail with reference to the accompanying drawings. Further, like or corresponding parts in each of the drawings will be designated by like reference numerals.

Figure 2:
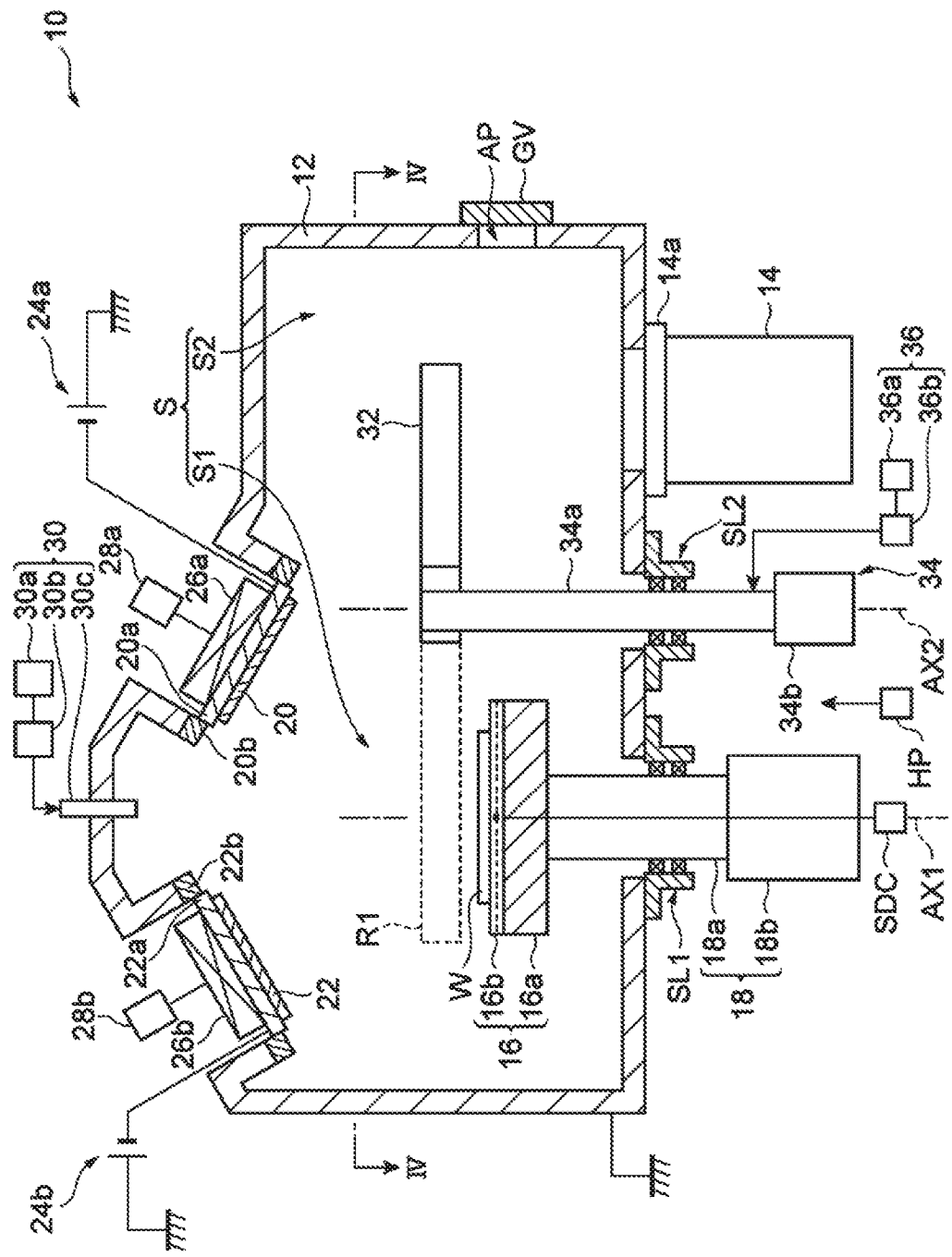
FIG. 2 is a view illustrating the deposition device according to the embodiment of the present disclosure.
Figure 3:
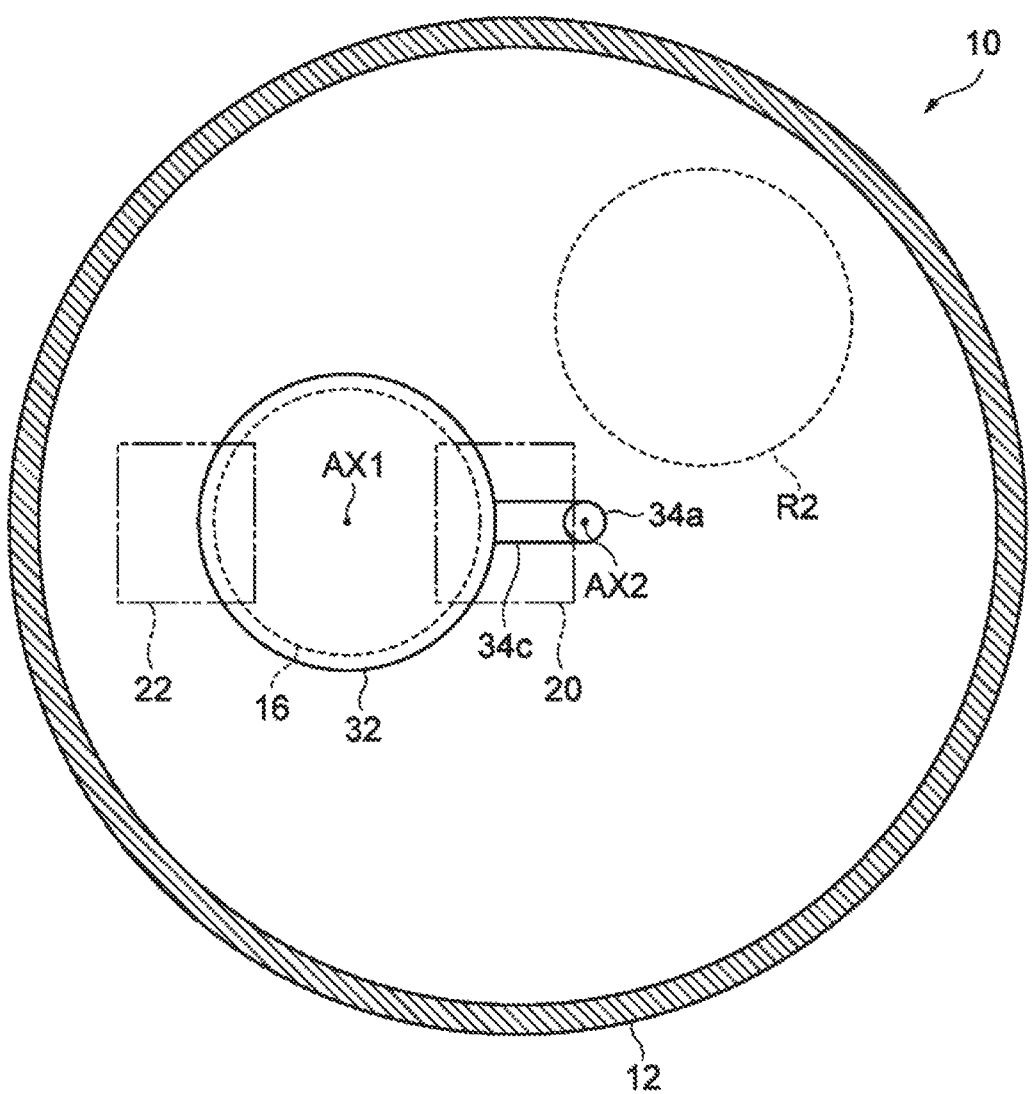
FIG. 3 is a view illustrating the deposition device according to the embodiment of the present disclosure.
Figure 4:
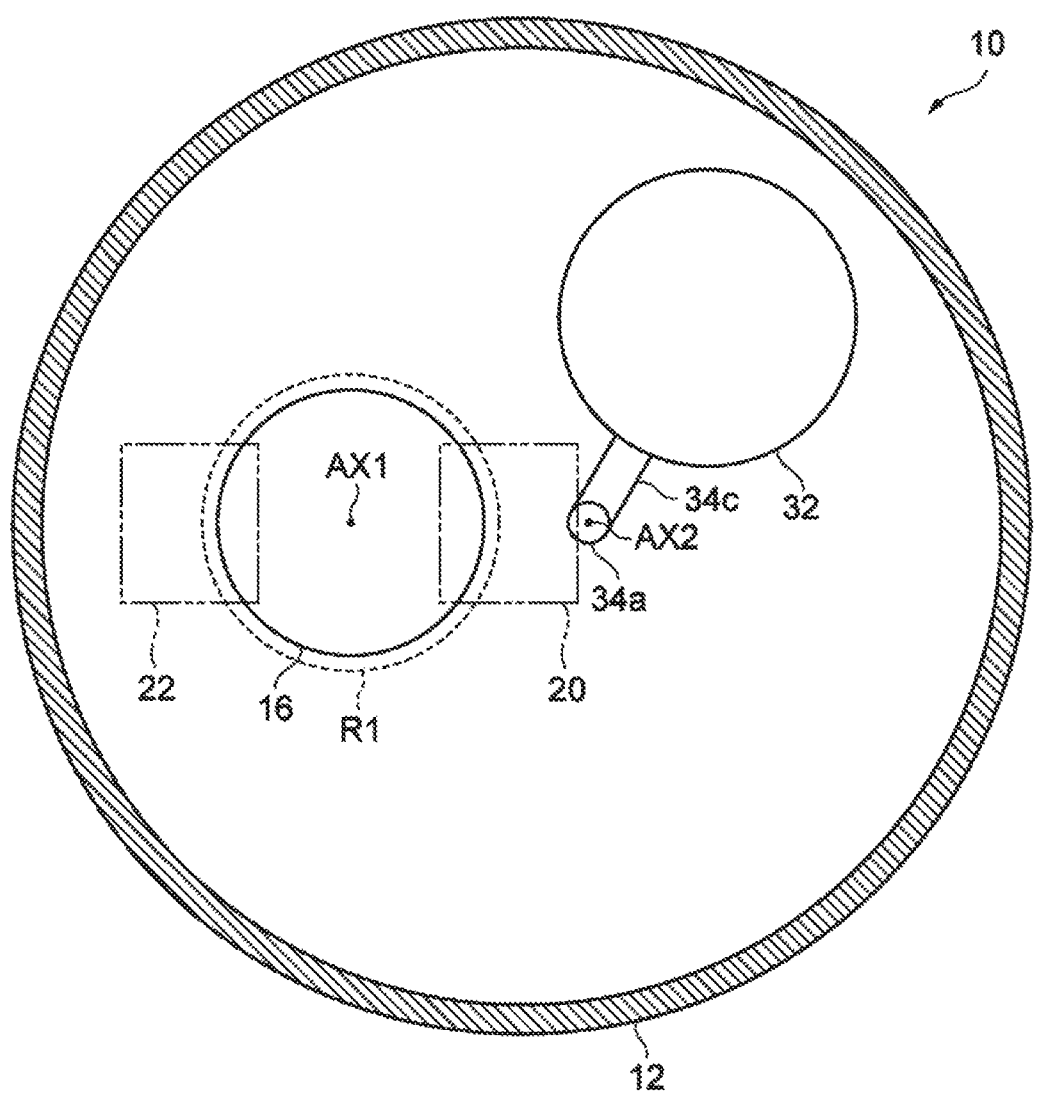
FIG. 4 is a view illustrating the deposition device according to the embodiment of the present disclosure.

First, a deposition device according to one embodiment of present disclosure will be described. FIG. 1, FIG. 2, FIG. 3 and FIG. 4 are views illustrating a deposition device according to one embodiment of the present disclosure. FIGS. 1 and 2 schematically illustrate a structure in a longitudinal section of the deposition device 10 according to the embodiment of the present disclosure. Further, FIG. 1 illustrates a state where a head of the deposition device 10 is disposed in a first region, and FIG. 2 illustrates a state where the head of the deposition device 10 is disposed in a second region. Moreover, FIG. 3 is a view taken along a line III-III in FIG. 1, and FIG. 4 is a view taken along a line IV-IV shown in FIG. 2.

As shown in the figures, the deposition device 10 includes a processing container 12. The processing container 12 is formed of, e.g., aluminum, and is connected to a ground potential. The processing container 12 has a space S defined therein. An exhaust device 14 for depressurizing the space S is connected to a bottom portion of the processing container 12 through an adapter 14a. Further, an aperture AP through which a target object (hereinafter, referred to as a "wafer") W is transferred is formed in a sidewall of the processing container 12. A gate valve GV for closing and opening the aperture AP is installed along the sidewall.

A mounting table 16 is installed inside the processing container 12. The mounting table 16 includes a base part 16a and an electrostatic chuck 16b. The base part 16a is formed of, e.g., aluminum, and has a substantially disc shape. In one embodiment, a temperature control mechanism may be installed within the base part 16a. As an example, a coolant flow channel through which a coolant circulates may be formed within the base part 16a.

The electrostatic chuck 16b is installed on the base part 16a. The electrostatic chuck 16b includes a dielectric film and an electrode formed as an inner layer of the dielectric film. A direct current power supply SDC is connected to the electrode of the electrostatic chuck 16b. The wafer W mounted on the electrostatic chuck 16b is adsorbed to the electrostatic chuck 16b by virtue of an electrostatic force generated by the electrostatic chuck 16b. Further, in an upper surface of the electrostatic chuck 16b, a region in which the wafer W is mounted is defined as a mounting region PR for the wafer W.

The mounting table 16 is connected to a mounting table driving mechanism 18. The mounting table driving mechanism 18 includes a supporting shaft 18a and a driving part 18b. The supporting shaft 18a extends from a position directly below the mounting table 16 in the space S up to the outside of the processing container 12 through the bottom portion of the processing container 12. A sealing member SL is installed between the supporting shaft 18a and the bottom portion of the processing container 12. The sealing member SL seals a gap between the bottom portion of the processing container 12 and the supporting shaft 18a such that the supporting shaft 18a is rotatable and is vertically movable. An example of the sealing member SL may include a magnetic fluid seal.

One end of the supporting shaft 18a is connected to the mounting table 16 and the other end thereof is connected to the driving part 18b. The driving part 18b generates a driving force by which the supporting shaft 18a is rotated and vertically moved. The mounting table 16 is rotated about an axis line AX1 with the rotation of the supporting shaft 18a, and is moved up and down with the vertical movement of the supporting shaft 18a.

A metal target 20 is installed above the mounting table 16. When a barrier layer of an MTJ element is formed, the metal target 20 may be a target of Mg. In some embodiments, the metal target 20 may be arbitrarily selected according to a type of metal oxide layer to be deposited. This metal target 20 is held by a metal holder 20a. The holder 20a is supported to a ceiling portion of the processing container 12 via an insulating member 20b.

In one embodiment, a target 22 made of an active metal may be further installed above the mounting table 16. As described below, the target 22 is used to increase a degree of vacuum of the processing container 12 by coating an inner wall surface of the processing container 12 with the active metal and using a gettering function of the active metal. The target 22 may be a target formed of, e.g., Ti or Ta. The target 22 is held by a metal holder 22a. The holder 22a is supported to the ceiling portion of the processing container 12 via an insulating member 22b.

The targets 20 and 22 are installed in an approximately symmetrical relationship with respect to a virtual plane including the axis line AX1. Further, the targets 20 and 22 are obliquely installed such that upper portions thereof are closer to the axis line AX1 as they are orientated upward. Moreover, the axis line AX1 is a central axis line of the mounting table 16 and the mounting region PR, which extends in a vertical direction through a substantially center point of the mounting table 16, and is also a rotational axis line of the mounting table 16.

A power supply 24a is connected to the metal target 20 via the holder 20a. Further, a power supply 24b is connected to the target 22 via the holder 22a. Each of the power supplies 24a and 24b may be a direct current power supply. Moreover, a cathode magnet 26a is installed outside the processing container 12 to face the target 20 through the holder 20a. Further, a cathode magnet 26b is installed outside the processing container 12 to face the target 22 through the holder 22a. The cathode magnets 26a and 26b are connected to magnet driving parts 28a and 28b, respectively.

In addition, the deposition device 10 includes a first gas supply part 30 configured to supply a gas into the processing container 12. In one embodiment, the first gas supply part 30 includes a gas source 30a, a flow controller 30b such as a mass flow controller, and a gas introduction part 30c. The gas source 30a is a source of a gas which is to be excited inside the processing container 12. An example of the gas source 30a is an Ar gas source. The gas source 30a is coupled to the gas introduction part 30c via the flow controller 30b. The gas introduction part 30c is a gas line for introducing the gas supplied from the gas source 30a into the processing container 12. In one embodiment, the gas introduction part 30c extends along the axis line AX1.

If the first gas supply part 30 supplies the gas and the power supply 24a or 24b applies a voltage to the respective target 20 or 22, the gas supplied into the processing container 12 is excited. Further, if the magnet 26a or 26b is driven by the respective magnet driving part 28a or 28b, a magnetic field is generated around the respective target 20 or 22. This causes plasma to be concentrated near the respective target 20 or 22. Then, positive ions in the plasma collide against the respective target 20 or 22 so that a material constructing the respective target 20 or 22 is emitted from the respective target 20 or 22. With this, for the target 20, the metal constructing the target 20 is deposited on the wafer W. Meanwhile, the active metal emitted from the target 22 coats the inner wall surface of the processing container 12, which will be described later.

Figure 5:
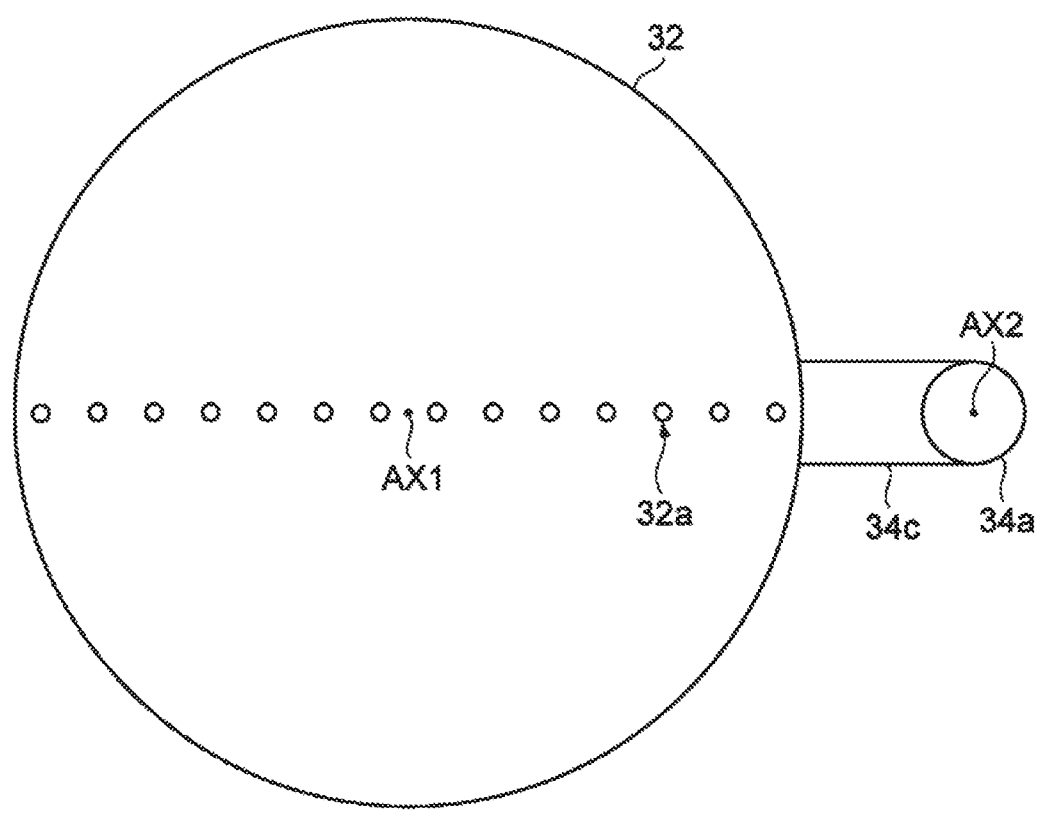
FIG. 5 is a plan view illustrating one example of a head.

Further, the deposition device 10 further includes a head 32. FIG. 5 is a plan view illustrating an example of the head, when viewed from the bottom. The following description will be made with reference to FIGS. 1 to 4, in addition to FIG. 5. The head 32 is configured to spray an oxidizing gas for oxidizing the metal deposited on the wafer W, toward the mounting table 16.

The head 32 is connected to a head driving mechanism 34 configured to pivotably support the head 32. In one embodiment, the head driving mechanism 34 includes a supporting shaft 34a and a driving part 34b. The supporting shaft 34a extends along an axis line AX2. The axis line AX2 is substantially in parallel with the axis line AX1 and vertically extends with respect to a lateral side of the mounting table 16. In some embodiments, the head 32 has a substantially disc shape. A distance between a central position of the head 32 and the axis line AX2 is approximately equal to a distance between the axis line AX1 and the axis line AX2.

The supporting shaft 34a is installed to extend from the interior of the processing container 12 to the outside of the processing container 12. A sealing member SL2 is installed between the supporting shaft 34a and the bottom portion of the processing container 12. The sealing member SL2 seals a gap defined between the bottom portion of the processing container 12 and the supporting shaft 34a such that the supporting shaft 34a is rotatable. An example of the sealing member SL2 may include a magnetic fluid seal.

An upper end of the supporting shaft 34a is connected to one end of a connection part 34c that extends in a direction perpendicular to the axis line AX2. The other end of the connection part 34c is connected to a peripheral portion of the head 32. Meanwhile, a lower end of the supporting shaft 34a is connected to the driving part 34b. The driving part 34b generates a driving force for rotating the supporting shaft 34a. The head 32 is swung about the axis line AX2 with the rotation of the supporting shaft 34a.

Specifically, the head 32 moves between a region R1 and a region R2 with the operation of the head driving mechanism 34. The region R1 is a region defined above the mounting table 16, which is a region within a space S1 defined between the targets 20 and 22 and the mounting table 16. Further, the region R2 is a region spaced apart from the space S1, i.e., a region within a space S2 different from the space S1.

A gas line GL for the oxidizing gas is formed in the supporting shaft 34a, the connection part 34c and the head 32. One end of the gas line GL is installed outside the processing container 12. The one end of the gas line GL is connected to a second gas supply part 36. The second gas supply part 36 includes a gas source 36a and a flow controller 36b such as a mass flow controller. The gas source 36a is a source of the oxidizing gas, for example, an $O_2$ gas source. The gas source 36a is connected to the one end of the gas line GL via the flow controller 36b.

In the head 32, the gas line GL is connected to a plurality of gas injection ports 32a formed in the head 32. Further, in one embodiment, the head 32 has a planar size larger than that of the mounting region PR of the mounting table 16. That is to say, the head 32 is positioned between the mounting table 16 and the targets 20 and 22 and has a size sufficient to cover the wafer W. Further, the plurality of gas injection ports 32a in the head are arranged in a direction perpendicular to the axis line AX2 and are opened downward, i.e., toward the mounting table 16. In some embodiments, the head 32 may have an elongated planar shape extending in a direction of the arrangement of the gas injection ports 32a.

Figure 6:
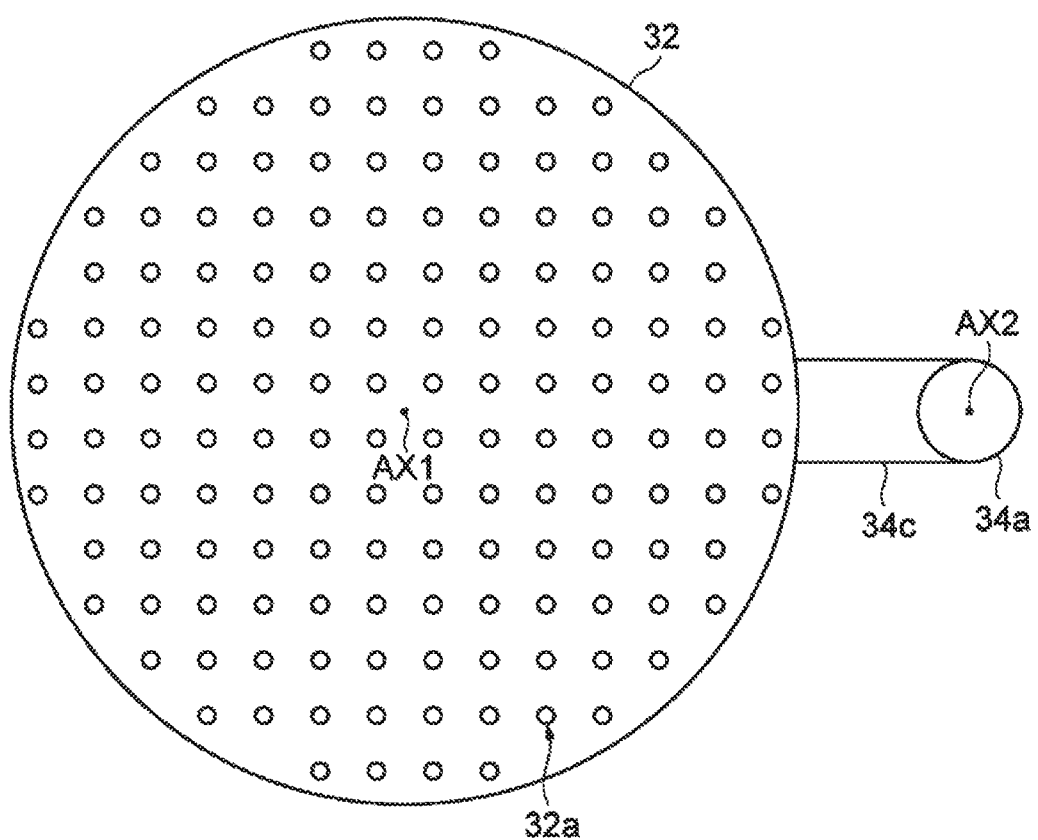
FIG. 6 is a plan view illustrating another example of the head.

FIG. 6 is a plan view illustrating another example of the head, when viewed from the bottom. The head 32 shown in FIG. 6 is different from the head shown in FIG. 5 in that the plurality of gas injection ports 32a are distributed over the entire surface of the head 32.

Further, in one embodiment, as shown in FIG. 1, a heater HT is installed in the head 32. The heater HT may be a heater based on any of various heating modes such as lamp radiation, Joule resistance heating, induction heating, and microwave heating. The heater HT is connected to a heater power supply HP so that the heater HT generates heat by electrical power applied from the heater power supply HP.

With the deposition device 10 configured as above, it is possible to perform the deposition of the metal on the wafer W and the oxidation process of the metal layer inside the single processing container 12. Specifically, as shown in FIGS. 2 and 4, the metal is emitted from the target 20 in a state where the head 32 is placed in the second region R2 so that the metal is deposited on the wafer W. Further, as shown in FIGS. 1 and 3, the oxidizing gas is supplied toward the wafer W in a state where the head 32 is placed in the first region R so that the deposited metal is oxidized. In this way, the deposition device 10 can perform the deposition of the metal on the wafer W and the oxidation process of the metal layer inside the single processing container 12, which makes it possible to shorten a period of time required to form the metal oxide layer.

Further, the deposition device 10 can heat the oxidizing gas and the wafer W by the heater HT in the course of the oxidation process of the metal layer. This facilitates the oxidation of the metal, which makes it possible to further shorten the period of time required for the oxidation process of the metal.

Further, according the deposition device 10, it is possible to, prior to the deposition of the metal, perform a process (i.e., a pre-sputtering) of cutting a surface of the target 20 in a state where the wafer W is covered by the head 32 placed in the first region R1. Accordingly, according to the deposition device 10, it is possible to reduce or prevent pollution of the wafer W during the pre-sputtering.

Further, prior to the formation of the metal layer, the deposition device 10 enables the inner wall surface of the processing container 12 to be coated with the active metal emitted from the target 22 in the state where the wafer W is covered by the head 32 placed in the first region R1. Then, the gettering function of the active metal coated on the inner wall surface of the processing container 12 increases the degree of vacuum of the processing container 12. As a result, it is possible to form a high-quality metal oxide layer.

Figure 7:
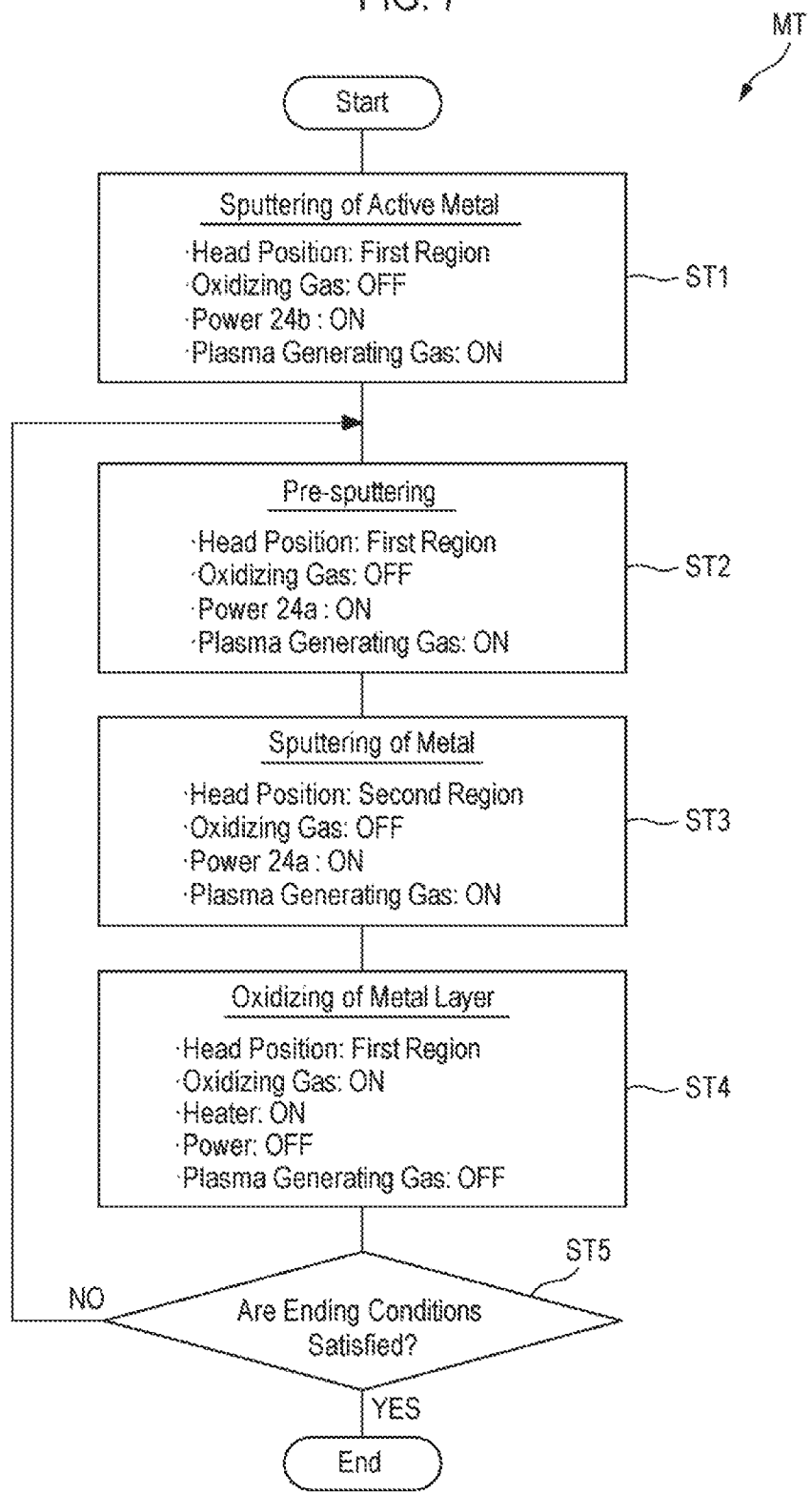
FIG. 7 is a flowchart illustrating a deposition method according to one embodiment of the present disclosure.

Hereinafter, a deposition method according to one embodiment of the present disclosure which can be implemented using the deposition device 10 will be described. FIG. 7 is a flowchart illustrating the deposition method according to one embodiment. The method MT illustrated in FIG. 7 includes a metal sputtering, i.e., step ST3 of depositing the metal on a wafer W, and step ST4 of oxidizing the deposited metal. In the method MT, these steps ST3 and ST4 are alternately repeated. Further, the method MT may further include optional steps ST1 and ST2. Hereinafter, the method MT will be described with reference to the flowchart illustrated in FIG. 7.

First, in the method MT, the wafer W is conveyed into the processing container 12 where the wafer is mounted on the mounting table 16.

Subsequently, step ST1 of the method MT is performed. The sputtering of the active metal is performed in step ST1. To do this, the head 32 is placed in the first region R1 in step ST1. At this time, a vertical position of the mounting table 16 is set such that the mounting table 16 is positioned below the head 32. Further, the first gas supply part 30 supplies a gas into the processing container 12, and the power supply 24b applies a voltage to the target 22. Then, a magnetic field is generated by the magnet 26b. In addition, the space S is set to a predetermined pressure by the exhaust device 14 in step ST1. For example, the power supplied from the power supply 24b to the target 22 ranges from 50 to 1000 W, and a flow rate of the gas supplied from the first gas supply part 30 ranges from 10 to 500 sccm. Further, a processing time of step ST1 may range from 1 to 60 seconds. Further, the application of the voltage by the power supply 24a, the generation of the magnetic field by the magnet 26a, and the supply of the oxidizing gas from the second gas supply part 36 are stopped in step ST1.

In step ST1, plasma is generated to be concentrated below the target 22. Positive ions in the generated plasma come into collision with the target 22 so that an active metal is emitted from the target 22. The inner wall surface of the processing container 12 is coated with the active metal thus emitted. By Step ST1, it is possible to increase the degree of vacuum of the processing container 12 by virtue of the gettering function of the coated active metal. As a result, a high-quality metal oxide layer can be formed. Further, since the wafer W is covered by the head 32 in step ST1, it is possible to reduce or prevent the contamination of the wafer W. In the flowchart illustrated in FIG. 7, step ST1 has been described to be performed only once at the beginning stage, but may be performed before each step or at any timing between two steps.

Thereafter, step ST2 of the method MT is performed. In step ST2, a pre-sputtering is performed. To do this, the head 32 is placed in the first region R1 in step ST2. At this time, the vertical position of the mounting table 16 is set such that the mounting table 16 is located below the head 32. Further, the gas is supplied from the first gas supply part 30 into the processing container 12, and a voltage is applied from the power supply 24a to the target 20. Then, a magnetic field is generated by the magnet 26a. Further, in step ST2, the space S is set to a predetermined pressure by the exhaust device 14. For example, in step ST2, the power supplied from the power supply 24a to the target 20 ranges from 50 to 1000 W, and a flow rate of the gas supplied to the first gas supply part 30 ranges from 10 to 500 sccm. Further, a processing time of step ST2 may range from 1 to 60 seconds. Further, the application of the voltage by the power supply 24b, the generation of the magnetic field by the magnet 26b, and the supply of the oxidizing gas from the second gas supply part 36 are stopped in step ST2.

In step ST2, plasma is generated to be concentrated below the target 20. Positive ions in the generated plasma come into collision with the target 20 so that the surface of the target 20 is shaved off. This removes the surface of the target 20 that may be contaminated during other steps. It is therefore possible to deposit the metal whose contamination level is suppressed on the wafer W in step ST3 as described later. Further, since the wafer W is covered by the head 32 in step ST2, it is possible to reduce or prevent the contamination of the wafer W.

Thereafter, step ST3 of the method MT is performed. In step ST3, a deposition of the metal on the wafer W, i.e., the metal sputtering, is performed. To do this, the head 32 is placed in the second region R2 in step ST3. At this time, the vertical position of the mounting table 16 is set to a position suitable to sputter the metal. Further, the mounting table 16 is rotated by the driving mechanism 18. Further, a gas is supplied from the first gas supply part 30 into the processing container 12, and a voltage is applied from the power supply 24a to the target 20.

Then, a magnetic field is generated by the magnet 26a. Moreover, the space S is set to a predetermined pressure by the exhaust device 14 in step ST3. For example, in step ST3, the number of revolutions of the mounting table 16 ranges from 30 to 300 rpm, the power supplied from the power supply 24a to the target 20 ranges from 50 to 1000 W, and a flow rate of the gas supplied from the first gas supply part 30 ranges from 10 to 500 sccm. Further, a processing time of step ST3 is set such that the metal is deposited at a film thickness ranging from 0.1 to 1 nm. Moreover, the application of the voltage by the power supply 24b, the generation of the magnetic field by the magnet 26b, and the supply of the oxidizing gas from the second gas supply part 36 are stopped in step ST3.

In step ST3, plasma is generated to be concentrated below the target 20. Then, positive ions in the generated plasma collide with the target 20 so that the metal is emitted from the surface of the target 20 and the emitted metal is deposited on the wafer W.

Thereafter, step ST4 of the method MT is performed. In step ST4, an oxidation process of the metal deposited on the wafer W is performed. To do this, the head 32 is placed in the first region R1 in step ST4. At this time, the vertical position of the mounting table 16 is set such that the mounting table 16 is positioned below the head 32. Further, the oxidizing gas is supplied from the second gas supply part 36 to the head 32. Moreover, in one embodiment, an electrical power is supplied from the heater power supply HP to the heater HT. Furthermore, the space S is set to a predetermined pressure by the exhaust device 14. For example, in step ST4, the number of revolutions of the mounting table 16 may range from 30 to 300 rpm, a flow rate of the oxidizing gas may range from 10 to 2000 sccm, and a temperature of the oxidizing gas may range from 50 to 300 degrees C. Further, a processing time of step ST4 may range from 1 to 300 seconds. Further, the application of the voltage by the power supplies 24a and 24b, the generation of the magnetic field by the magnets 26a and 26b, and the supply of the gas from the first gas supply part 30 are stopped in step ST4.

The metal deposited on the wafer W is oxidized by the oxidizing gas injected from the head 32 toward the mounting table 16 in step ST4. In this way, according to the method MT, it is possible to perform both the deposition process and the oxidation process of the metal in the single processing container 12. This shortens a period of time required to form the metal oxide layer. Further, since the oxidizing gas is heated by the heater HT in this embodiment, the oxidation of the metal layer is further facilitated, which makes it possible to further shorten the period of time required for the oxidation process of the metal.

Thereafter, step ST5 (determination step) of the method MT is performed. That is to say, it is determined in step ST5 whether ending conditions are satisfied. If it is determined that the ending conditions are satisfied, the method MT is ended, and if otherwise, a sequence of steps ST2 to ST4 is repeated. In some embodiments, the method MT may be configured to satisfy the ending conditions if the number of repetitions of steps ST2 to ST4 becomes a predetermined number.

Figure 8:
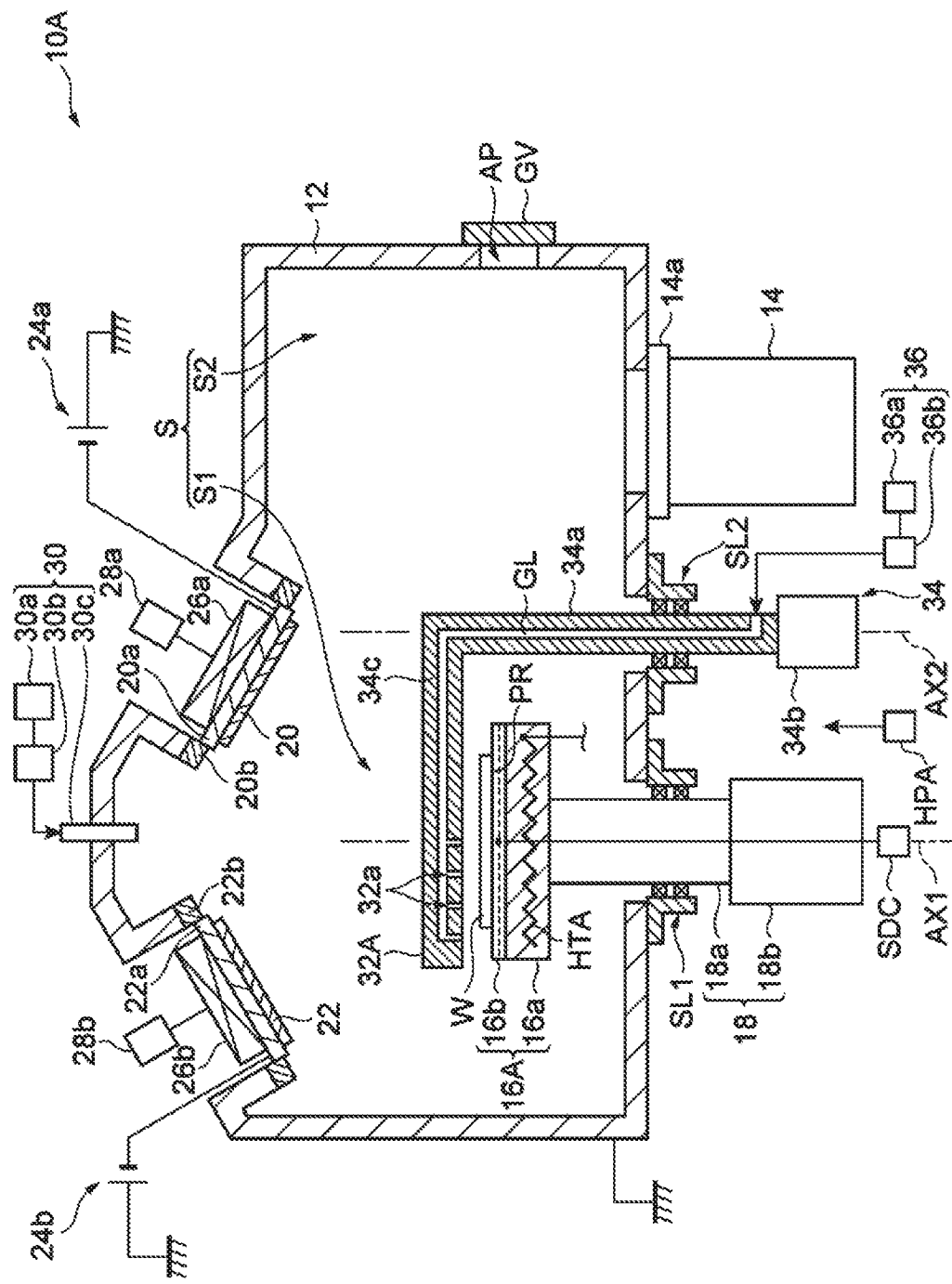
FIG. 8 is a view illustrating a deposition device according to another embodiment of the present disclosure.
Figure 9:
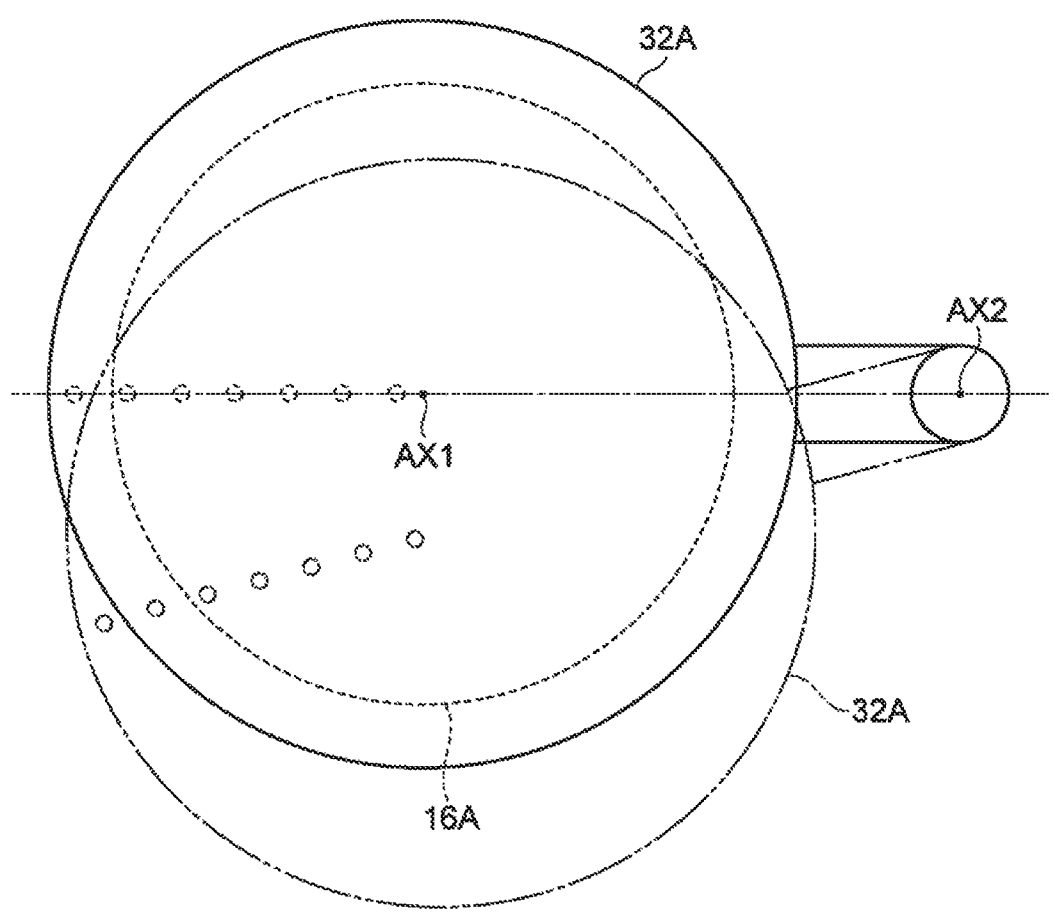
FIG. 9 is a view illustrating an operation of a head of the deposition device shown in FIG. 8.

Hereinafter, another embodiment of the present disclosure will be described. FIG. 8 is a view illustrating a deposition device according to another embodiment of the present disclosure. Similarly to FIG. 1, FIG. 8 illustrates a structure in a longitudinal section of a deposition device 10A according to another embodiment of the present disclosure, and shows a state where a head 32A of the deposition device 10A is placed in the first region R1. Further, FIG. 9 is a view illustrating an operation of the head 32A of the deposition device 10A, which is a plan view of the head 32A of the deposition device 10A when viewed from the top.

The deposition device 10A illustrated in FIG. 8 is different from the deposition device 10 in that a heater HTA is installed in a mounting table 16A. This heater HTA is connected to a heater power supply HPA.

Further, the deposition device 10A is different from the deposition device 10 in that no heater is installed in the head 32A. Further, a plurality of gas injection ports 32a is formed only in a radial region from the center of the head 32A to the periphery thereof in a direction perpendicular to the axis line AX2. Moreover, the gas injection ports 32a are disposed at an approximately regular pitch.

A deposition method that can be implemented using the deposition device 10A is similar to the method MT illustrated in FIG. 7 except that the mounting table 16A is heated in step ST4. When a metal to be oxidized is Mg, a temperature of the mounting table 16A in step ST4 may be set to, for example, a temperature ranging from 60 to 200 degrees C., and more preferably, from 80 to 200 degrees C. If the temperature is equal to or higher than 60 degrees C., an oxidation rate of Mg can be increased. Meanwhile, if the temperature is equal to or lower than 200 degrees C., an evaporation of Mg can be prevented.

The deposition method that can be implemented using the deposition device 10A also features that the head 32A is moved above the mounting table 16A in step ST4. Specifically, as shown in FIG. 9, the head 32A is continuously or stepwise moved from a position where the gas injection ports 32a are arranged on a straight line connecting the axis line AX1 with the axis line AX2 to another position designated by a dashed double-dotted line.

Figure 10A:
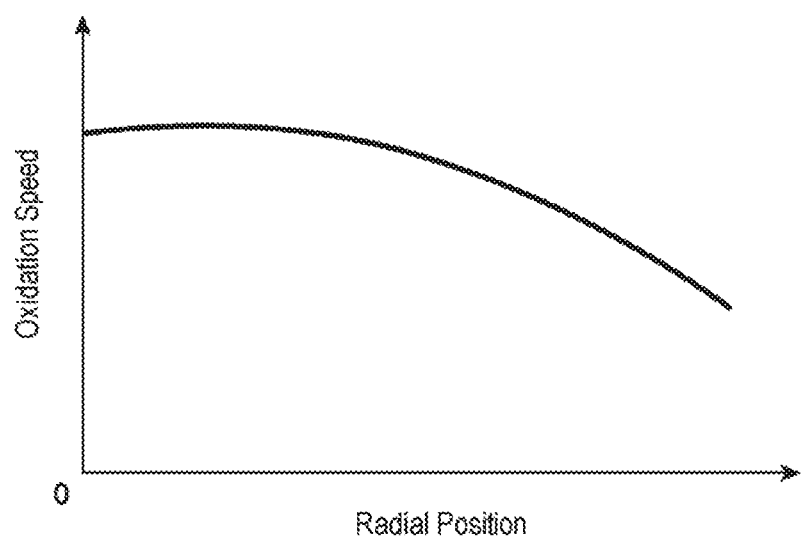
FIG. 10 is a view illustrating a relationship between a radial position of a wafer and an oxidation rate.
Figure 10B:
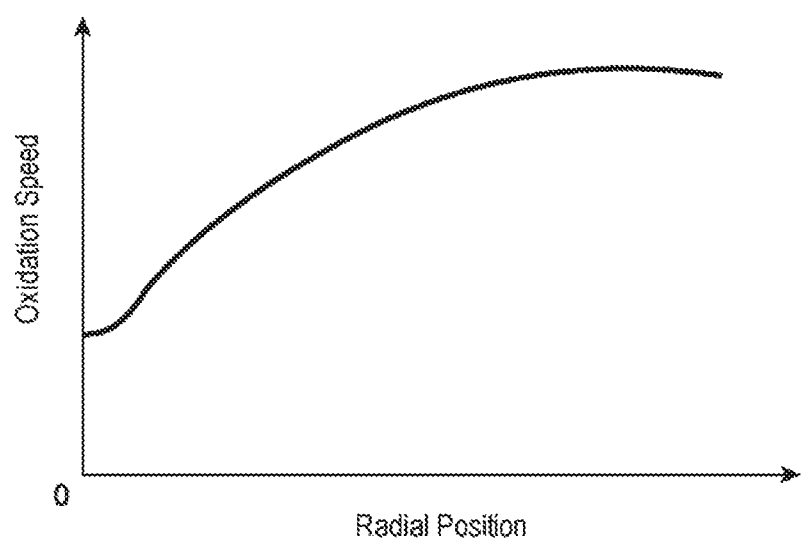

Here, the following description will be made with reference to FIGS. 10A and 10B. FIGS. 10A and 10B are views illustrating a relationship between a radial position of the wafer and an oxidation rate. In FIG. 10A, a horizontal axis represents the radial position from the center of the wafer while a vertical axis represents the oxidation rate. Further, FIG. 10A shows a distribution of the oxidation rate when the head 32A is placed at a position designated by a solid line in FIG. 9, while FIG. 10B shows a distribution of the oxidation rate when the head 32A is placed at the position designated by the dashed double-dotted line in FIG. 9.

During the period of step ST4, the mounting table 16A is rotated so that the wafer W is also rotated. As such, a circumferential velocity at each position of the wafer W varies depending on a distance from the axis line AX1. That is to say, the circumferential velocity at each position of the wafer W is increased as the distance from the center of the wafer W in a diametrical direction is increased. Accordingly, if the head 32A is placed such that the plurality of gas injection ports 32a are arranged to extend in the direction perpendicular to the axis line AX1 as designated by the solid line in FIG. 9, the amount of the oxidizing gas to be supplied is decreased as the position becomes closer to an edge of the wafer W. As a result, as shown in FIG. 10A, the oxidation rate of the metal becomes slower as the position becomes closer to the edge of the wafer W. Meanwhile, if the head 32A is placed as designated by the dashed double-dotted line in FIG. 9, the amount of the oxidizing gas to be supplied is increased as the position becomes closer to the edge of the wafer W. As a result, as shown in FIG. 10B, the oxidation rate of the metal becomes faster as the position becomes closer to the edge of the wafer W. Accordingly, it is possible to uniformly adjust an in-plane distribution of the oxidation of the metal by moving the position of the head 32A on the mounting table 16A in step ST4.

Figure 11:
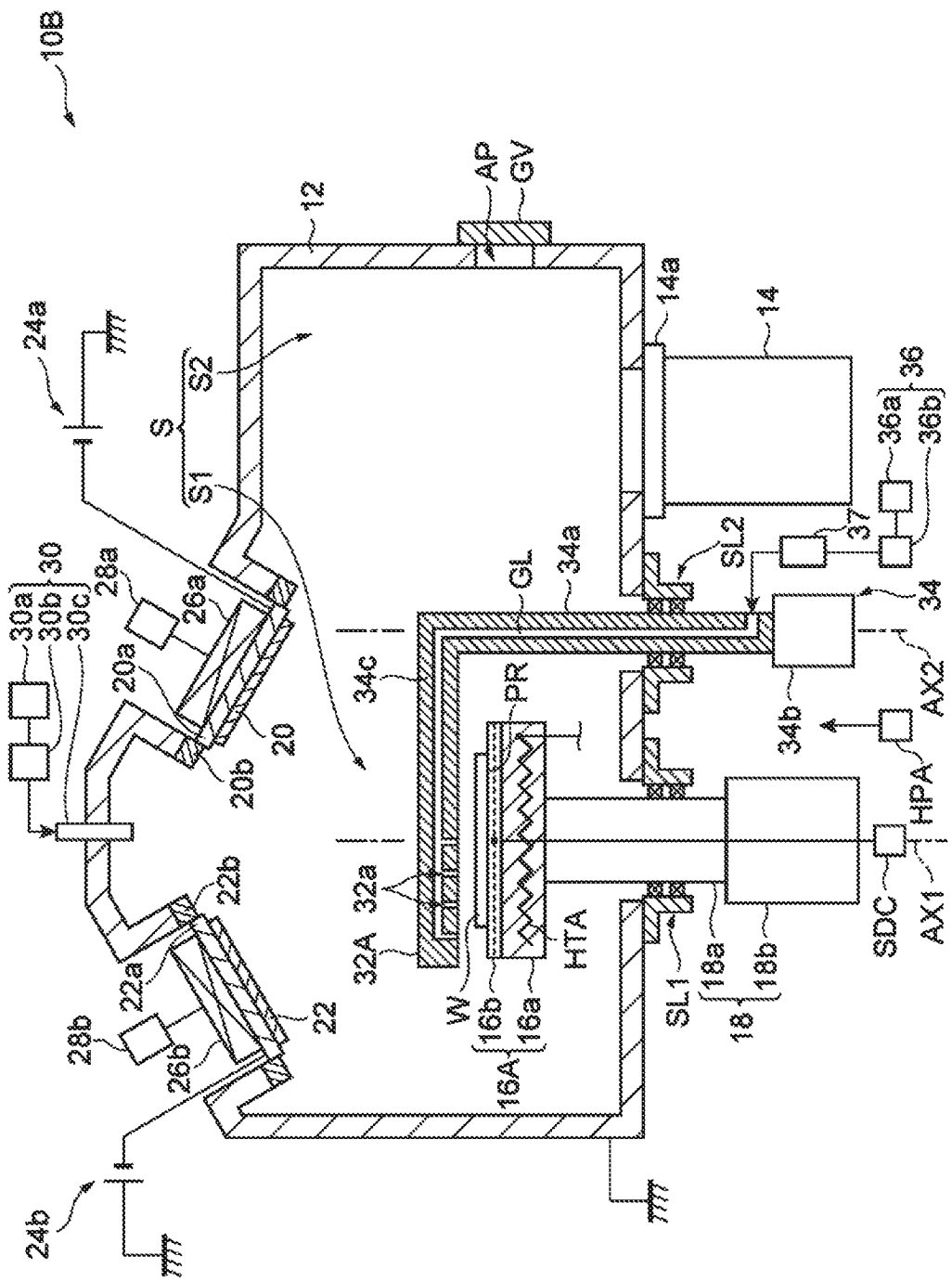
FIG. 11 is a view illustrating a deposition device according to yet another embodiment of the present disclosure.

Hereinafter, yet another embodiment of the present disclosure will be described. FIG. 11 is a view illustrating a deposition device according to yet another embodiment of the present disclosure. Similar to FIG. 8, FIG. 11 illustrates a structure in a longitudinal section of a deposition device 10B according to yet another embodiment of the present disclosure, which shows a state where a head of the deposition device 10B is placed in the first region.

The deposition device 10B illustrated in FIG. 11 is different from the deposition device 10A in that it includes a heating mechanism 37. The heating mechanism 37 is installed outside the processing container 12. The heating mechanism 37 is configured to heat the oxidizing gas, which is supplied from the second gas supply part 36 to the head 32A, outside the processing container 12. As an example, the heating mechanism 37 may be a heater installed in a pipe through which the second gas supply part 36 is coupled to the gas line GL. With this deposition device 10B, the heated oxidizing gas is supplied to the head 32A, thus facilitating the oxidation of the metal. This further shortens a period of time required to perform the oxidation process of the metal. In some embodiments, the deposition device 10B may or may not include the heater HTA.

A deposition method that may be implemented using the deposition device 10B is similar to the method MT illustrated in FIG. 7 except that the oxidizing gas heated by the heating mechanism 37 is supplied to the head 32A in step ST4. Further, the heating mechanism 37 can heat the oxidizing gas to a temperature ranging from 50 to 300 degrees C. in step ST4.

Although various embodiments have been described above, the present disclosure is not limited to the above embodiments but may be modified in various manners. As an example, in the heads illustrated in FIGS. 5 and 6, the pitches between neighboring gas injection ports 32a has been described to be uniform, but is not limited thereto. In some embodiments, the plurality of gas injection ports 32a may be formed such that an arrangement density of the gas injection ports 32a is increased as the position displaces from the center of the head to the periphery thereof. With this configuration, it is possible to uniformly supply the oxidizing gas throughout the entire region of the wafer W.

Further, while the device illustrated in FIG. 8 has been described to be configured as the deposition device, a configuration of the device, which is related to the oxidation process of the metal described with reference to FIGS. 8 to 10, may be used as a dedicated oxidation processing device that is separate from an apparatus dedicated to the sputtering of the metal. That is to say, such an oxidation processing device may be configured as a dedicated apparatus including the processing container 12, the exhaust device 14, the mounting table 16A, the mounting table driving mechanism 18, the head 32A, the head driving mechanism 34 and the second gas supply part 36. Further, similarly, the device illustrated in FIG. 11 may be also used as a dedicated oxidation processing device that is separate from the apparatus dedicated to the sputtering of the metal.

Further, while in the deposition device 10B, the oxidizing gas has been described to be heated by the heating mechanism 37 outside the processing container 12, an activated oxidizing gas may be configured to be supplied to the head 32A, instead of the oxidizing gas. As an example, a plasma generator configured to excite the oxidizing gas supplied from the second gas supply part 36 may be installed in the deposition device 10B. In this case, active species such as radicals originated from the oxidizing gas are supplied to the head 32A so that the metal is oxidized by the active species. Further, in some embodiments, the second gas supply part 36 may be configured to supply ozone. In this case, the metal is oxidized by the ozone.

EXPLANATION OF REFERENCE NUMERALS 10, 10A: deposition device, 12: processing container, R1: first region, R2: second region, 14: exhaust device, 16, 16A:

mounting table, PR: mounting region, 18: mounting table driving mechanism, 20: metal target, 22: target (active metal), 24a, 24b: power supply, 26a, 26b: cathode magnet, 30: first gas supply part, 32, 32A: head, 32a: gas injection ports, 34: head driving mechanism, 36: second gas supply part, HT, HTA: heater, AX1: axis line, AX2: axis line, W: wafer (target object)

What is claimed is:

1. A deposition device comprising:
   a processing container;
   an exhaust device configured to depressurize an internal pressure of the processing container;
   a mounting table, having a disc shape, installed inside the processing container and configured to mount a target object thereon;
   a metal target installed above the mounting table;
   a first gas supply part configured to supply a gas into the processing container;
   a power supply configured to generate power such that positive ions in the gas supplied from the first gas supply part collide against the metal target;
   a second gas supply part configured to supply an oxidizing gas;
   a head, having a disc shape, connected to the second gas supply part, including a plurality of gas injection ports arranged to open downward toward the mounting table, and configured to inject the oxidizing gas toward the mounting table, the head overlapping with an entire surface of the mounting table; and
   a head driving mechanism configured to move the head between a first region that is defined between the metal target and a mounting region where the target object is mounted on the mounting table and a second region spaced apart from a space defined between the metal target and the mounting region,
   wherein the head driving mechanism places the head in the second region while a metal emitted from the metal target is deposited on the target object, and places the head in the first region while the oxidizing gas is injected toward the mounting table.

2. The deposition device of claim 1, further comprising a heater installed in the head.

3. The deposition device of claim 1, further comprising a heating mechanism configured to heat the oxidizing gas supplied into the head,
   wherein the heating mechanism is installed outside the processing container.

4. The deposition device of claim 2, wherein a temperature of the oxidizing gas is adjusted to a temperature ranging from 50 degrees C. or more to 300 degrees C. or less.

5. The deposition device of claim 1, further comprising:
   a heater installed in the mounting table; and
   a mounting table driving mechanism configured to rotate the mounting table about a first axis line which vertically extends along a central axis line of the mounting table,
   wherein the head driving mechanism pivotably supports the head about a second axis line which vertically extends at a lateral side of the mounting table.

6. The deposition device of claim 5, wherein a temperature of the mounting table is adjusted to a temperature ranging from 60 degrees C. or more to 200 degrees C. or less.

7. The deposition device of claim 1, wherein the head has a planar size larger than that of the mounting region.

8. The deposition device of claim 7, further comprising a target made of an active metal installed above the mounting table.

9. The deposition device of claim 8, wherein the active metal is Ti or Ta.

10. The deposition device of claim 1, wherein the metal target is an Mg target.

11. A deposition method using the deposition device of claim 1, the deposition method comprising:
    depositing a metal emitted from the metal target onto the target object, in a state where the head is placed in the second region; and
    injecting the oxidizing gas from the head toward the target object to oxidize the metal deposited on the target object, in a state where the head is placed in the first region,
    wherein the step of depositing and the step of injecting are alternately repeated.

12. The deposition method of claim 11, wherein the deposition device further comprises a heater installed in the head, and
    wherein, in the step of oxidizing the metal, the deposited metal is oxidized by the oxidizing gas heated in the head.

13. The deposition method of claim 11, wherein the deposition device further comprises a heating mechanism installed outside the processing container and configured to heat the oxidizing gas supplied into the head, and
    wherein, in the step of oxidizing the metal, the deposited metal is oxidized by the oxidizing gas heated by the heating mechanism.

14. The deposition method of claim 11, wherein the deposition device further comprises:
    a heater installed in the mounting table; and
    a mounting table driving mechanism configured to rotate the mounting table about a first axis line which vertically extends along a central axis line of the mounting table,
    wherein the head driving mechanism pivotably supports the head about a second axis line which vertically extends at a lateral side of the mounting table,
    wherein a plurality of gas injection ports arranged in a direction perpendicular to the second axis line is formed in the head, and
    wherein, in the step of oxidizing the metal, the head is moved about the second axis line above the mounting table.

15. The deposition method of claim 11, wherein the head has a planar size larger than that of the mounting region.

16. The deposition method of claim 15, further comprising, before the step of depositing the metal, the step of causing positive ions to collide against the metal target in the state where the head is placed in the first region.

17. The deposition method of claim 15, wherein the deposition device further comprises a target made of an active metal installed above the mounting table, and
    wherein the deposition method further comprises, before the step of depositing the metal, the step of causing the positive ions to collide against the target made of the active metal in the state where the head is placed in the first region.

18. The deposition method of claim 17, wherein the active metal is Ti or Ta.

19. The deposition method of claim 11, wherein the metal target is an Mg target.

* * * * *